(12) United States Patent
Lin et al.

(10) Patent No.: US 8,315,281 B2
(45) Date of Patent: Nov. 20, 2012

(54) FIBER RING LASER SYSTEM AND THE OPERATION METHOD THEREOF

(75) Inventors: Zih-Rong Lin, Dali (TW);
Cheng-Kuang Liu, Taipei (TW);
Yu-Jhu Jhang, Zhongli (TW); Gerd Keiser, Newton, MA (US)

(73) Assignee: National Taiwan University of Science and Technology, Taipei (TW)

( * ) Notice: Subject to any disclaimer, the term of this patent is extended or adjusted under 35 U.S.C. 154(b) by 66 days.

(21) Appl. No.: 13/052,051

(22) Filed: Mar. 19, 2011

(65) Prior Publication Data
US 2012/0170600 A1 Jul. 5, 2012

(30) Foreign Application Priority Data
Dec. 30, 2010 (TW) ................. 99147003 A

(51) Int. Cl.
*H01S 3/30* (2006.01)
(52) U.S. Cl. ............. 372/6; 372/8; 372/20; 372/29.022; 372/38.06
(58) Field of Classification Search .............. 372/6, 8, 372/20, 29.022
See application file for complete search history.

(56) References Cited

U.S. PATENT DOCUMENTS
2005/0215985 A1* 9/2005 Mielke et al. ............... 606/2
2009/0310627 A1* 12/2009 Chen et al. ............... 372/6
2010/0322624 A1* 12/2010 Liu et al. ............... 398/41

OTHER PUBLICATIONS

Zih-Rong Lin, Cheng-Kuang Liu, Yu-Jhu Jhang, Gerd Keiser ; Title: Tunable directly modulated fiber ring laser using a reflective semiconductor optical amplifier for WDM access networks; Aug. 2, 2010 Published online, vol. 18, No. 17, 17610-17619,Publisher: Optics Express (Online Journal Publisher), Published: Worldwide.
Zih-Rong Lin, Cheng-Kuang Liu, Yu-Jhu Jhang, Gerd Keiser; Title: Directly Modulated Fiber Ring Laser for Optical Communication; Published Jul. 14, 2010, P 1-103, Publisher: Department of Electronic Engineering, National Taiwan University of Science and Technology, Published in Taipei City, Taiwan.

* cited by examiner

*Primary Examiner* — Dung Nguyen
(74) *Attorney, Agent, or Firm* — Chih Feng Yeh; Huntington IP Consulting Co., Ltd.

(57) ABSTRACT

A wavelength-tunable directly modulated fiber ring laser is provided. Generally speaking, the wavelength-tunable directly modulated fiber ring laser employs an RSOA (reflective semiconductor optical amplifier) and an OTF (optical tunable filter) to construct a novel ring resonant cavity. Additionally, a signal generator can be further employed to transmit modulated signals to the RSOA, whereby generating light wave with the modulated signals, so as to provide tunable wave-length and direct modulation at the same time.

10 Claims, 6 Drawing Sheets

FIBER RING LASER SYSTEM AND THE OPERATION METHOD THEREOF

CROSS-REFERENCE TO RELATED APPLICATION

This present application claims priority to TAIWAN Patent Application Serial Number 099147003, filed on Dec. 30, 2010, which is herein incorporated by reference.

TECHNICAL FIELD

The present invention generally relates to a fiber ring laser, in particular to a wavelength-tunable directly modulated fiber ring laser.

DESCRIPTION OF RELATED ART

In pace with the development of technology, the requirement of communication for people surges day by day, and thus, the communication system becomes more and more complicated, and the desired bandwidth are increased accordingly. In order to achieve a speedier and safer transmission, the optical fiber network system is widely utilized in recent years so as to meet aforementioned requirements.

In the architecture of a traditional optical fiber network, the fiber transmits optical signals (or light) to a location distant from a user node, and subsequently converts those signals to electric signals, and then, the coaxial cable transmits those electric signals to each user node. According to the distance between the fiber and the user node, the fiber network can be classified in the following schemes. The first one is called FTTN (Fiber to the Node). In this scheme, the fibers can transmit optical signals to the location distant from the user node several kilometers, and subsequently convert those optical signals to electronic signals, and then, those electronic signals can be transmitted to each user node via a dendritic frame formed by cheaper copper wires. The second one is called FTTB (Fiber to the Building). In this scheme, the fiber is extended to a machine room of user nodes, so as to get closer to user nodes, thereby improving transmission ability. In order to purse higher quality of personal network, a scheme called FTTP (Fiber to the Premises) is proposed in recent years. In this scheme, the copper wire near the user node is replaced with the fiber. That is, the fiber can be connected directly to the user nodes located in the house or in the office. The transmission rate of the FTTP scheme can reach 100 Mbps, which is significantly better than the transmission rate of the traditional DSL (Digital Subscriber Line) having a transmission rate of about 12 Mps~40 Mps. Hence, the FTTP can provide broader bandwidth and higher transmission quality, and it makes the fiber play a more and more important role in the communication system.

A conventional fiber ring laser employs a fiber, an optical isolator, an optical filter, an optical coupler, an active laser source, etc, to construct a resonant cavity. It can generate and output laser light while sufficing the resonant condition. When the fiber ring laser is used to transmit optical signals in a long distance, the decay of optical signals and the sensitivity for receiving signals have to be considered. If the transmission distance is too long to keep the power of received light for satisfying the sensitivity demand of the receiver, an optical relay or an optical amplifier can be introduced in the transmission path, wherein the optical relay can receive optical signals and convert those signals to electronic signals, and then it can amplify the electric signals and transform the wave profile. In this case, an optical emitter may be required to convert electric signals back to optical signals and to emit those optical signals back into the fiber. The operation of the optical relay may be affected by the modulated patterns, and transmission rate of signals. If the transmission rate or pattern of the transmission system changes, the optical relay should be replaced accordingly. This is not quite cost-effective. In contrast to the optical relay, a fiber amplifier doesn't need to convert optical signals into electronic signals, and further, it may not be affected by the modulated pattern or transmission rate of signals. Thus, in comparison to the optical relay, the fiber amplifier can be widely applied in various transmission systems, which is more cost-effective. Moreover, in order to enhance the gaining effect, an EDF (Erbium-Doped Fiber) amplifier is further provided which exhibits characteristics of high gain, broad bandwidth and low noise. It mainly comprises a pumping laser, an EDF, an optical multiplexer, and an optical isolator. Due to the instability of the Erbium atom in the EDF, the electron of the Erbium ion forms population inversion by activated by the pumping laser, and it can be elevated from the low energy level to the high energy level. The rate of simulated emission generated by population inversion is greater than the rate of absorption, so that the gain can be amplified.

The light source generally used in the conventional fiber is a semiconductor laser. But the semiconductor laser manufactured by identical process just emits particular wavelength, which means the wavelength is not tunable. If there is a need to use different wavelength for increasing users of network, another particular process has to be provided for providing different semiconductor laser, and that is not cost-effective and not easy to be modified or expanded. For overcoming aforementioned issues, a wavelength-tunable fiber ring laser is subsequently proposed, and it has a wide range of tunable wavelength, so that aforementioned issues can be solved effectively. However, aforementioned fiber ring laser can only introduce an external modulator to load signals into light, which is very inconvenient. Therefore, it is urgent to develop a laser with both tunable wavelength and ability of being directly modulated, so as to facilitate to promote the convenience of fiber network and to reduce the manufacturing cost.

In view of the aforementioned description, there are some difficulties and shortcomings still existing in the well-known fiber network to be overcome.

SUMMARY

For overcoming aforementioned difficulties and shortcomings, the present invention provides a fiber ring laser, and more specifically, it relates to a wavelength-tunable directly modulated fiber ring laser.

One purpose of the present invention is to provide a fiber ring laser system, in which the wavelength is tunable and the signals can be directly modulated in the ring resonant cavity, thereby attaining both tunable wavelength and direct modulation.

Another purpose of the present invention is to provide a fiber ring laser system, which can filter noises effectively, so that the quality of signals can be maintained well during transmission in a long distance.

For achieving aforementioned purposes, the present invention provides a fiber ring laser system, which comprises a signal generator and a ring resonant cavity, wherein the ring resonant cavity includes: a RSOA (reflective semiconductor optical amplifier) used to generating light with broadband wavelength, and capable of providing gain and suppressing noises; an optical circulator coupled to the RSOA, whereby controlling transmission direction of light, such that light can be transmitted along a fixed direction in the ring resonant cavity; an optical coupler coupled to the optical circulator, whereby transmitting part of the light out of the ring resonant cavity, and retaining another part of the light in the ring resonant cavity; a tunable optical filter coupled to the optical coupler, whereby filtering light to obtaining desired wavelength. Besides, aforementioned signal generator is coupled to the RSOA in the ring resonant cavity, whereby loading modulated signals into light, and further achieving the purpose of direct modulation.

In another aspect, the present invention further provides an operation method of a fiber ring laser, and its steps are described as follows. At first, light is emitted from a RSOA to an optical coupler. Next, part of light is outputted out of a ring resonant cavity and another part of light is transmitted to a tunable optical filter by the optical coupler. Then, another part of light mentioned above is filtered to retain particular wavelength and it is transmitted to the RSOA by the tunable optical filter. Subsequently, modulated signals are transmitted to the RSOA by a signal generator, whereby generating light with the modulated signals. Last, part of light with the modulated signals is transmitted out of the ring resonant cavity.

By aforementioned technical features, the modulated signals can be loaded into the laser light directly, and because the present invention includes a tunable optical filter, the purpose of having both tunable wavelength and direct modulation can be accomplished.

One advantage of the present invention is that the wavelength tunable range is about 1535 nm-1580 nm, covering the both C-band and L-band, which are commonly used in optical communication, and hence, the present invention can be widely applied in current communication system.

Another advantage of the present invention is that the line width of laser disclosed in the present invention is about 2.14-KHz, and that is better than 10-KHz, which is the line width provided by EDF.

Another advantage is that the wavelength tunable range reaches 45 nm, which is better than traditionally tunable fiber laser.

The other advantage of the present invention is that the critical (or driving) current is only 14 mA, which is lower than traditional tunable fiber laser, so as to facilitate to activate the laser to generate light, such that the present invention is more power-saving and cost-effective Aforementioned description is to illustrate purposes of the present invention, technical characteristics to achieve the purposes, and the advantages brought from the technical characteristics, and so on. And the present invention can be further understood by the following description of the preferred embodiment accompanying with the claims.

DETAILED DESCRIPTION

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

The present invention provides a wavelength-tunable directly modulated fiber ring laser system. Generally speaking, the system employs a RSOA (reflective semiconductor optical amplifier) and a tunable optical filter to construct a novel ring resonant cavity. Moreover, the present invention further couple the RSOA to a signal controller for receiving modulated signals and loading those signals into emitted light, thereby accomplishing the purpose of direct modulation.

Figure 1:
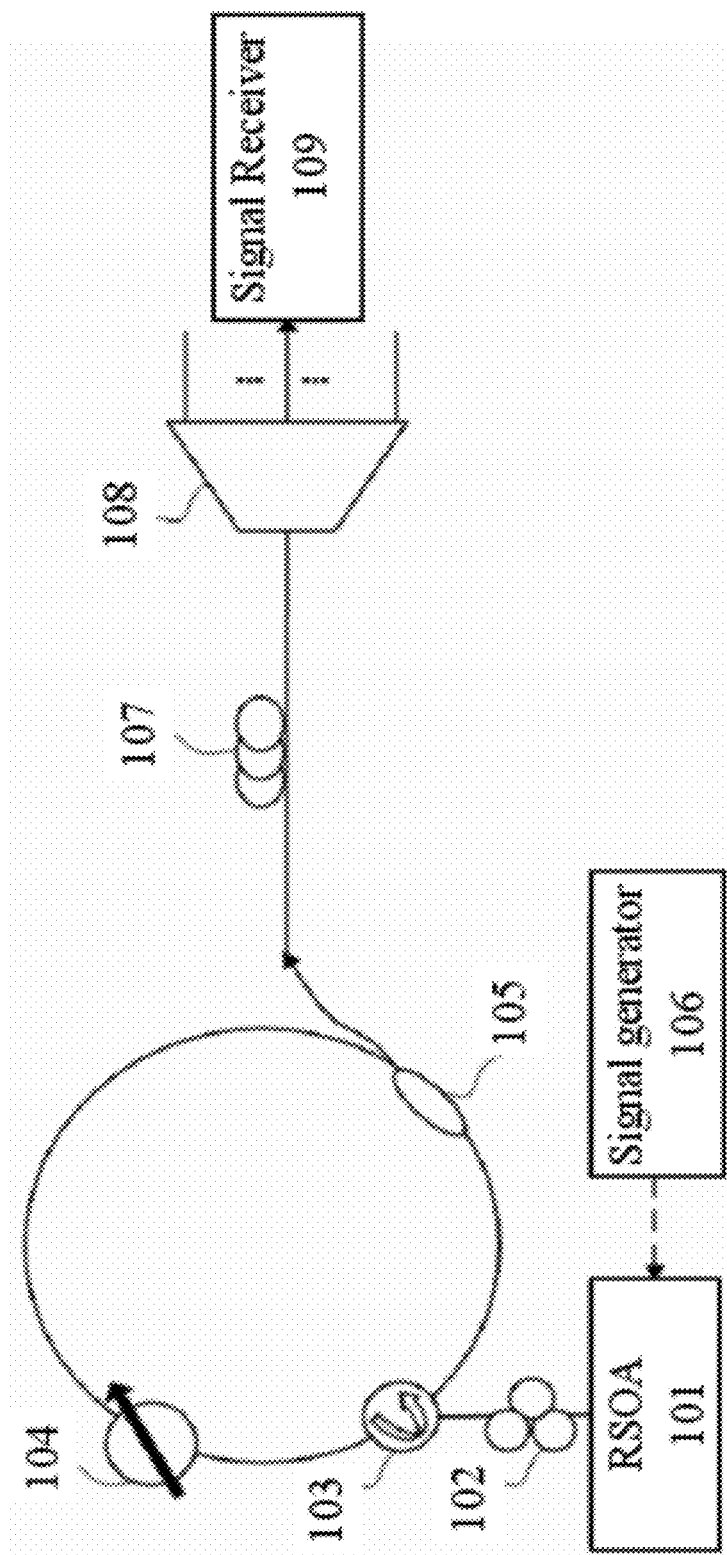
FIG. 1 shows the preferred embodiment of the fiber ring laser system of the present invention.

Referred to FIG. 1, it shows a preferred embodiment of the fiber ring laser system disclosed by the present invention. As shown, the ring resonant cavity of the present invention is composed of a RSOA 101, an optical polarization controller 102, an optical circulator 103, a tunable optical filter 104, and an optical coupler 105. The RSOA 101 can be driven by a power supply (not shown) to generate broadband light and provide gain. The optical polarization controller 102 is coupled to the RSOA 101 for controlling the polarization state of light. The optical circulator 103 is coupled to the optical polarization controller 102 for controlling the transmission direction of light. Specifically speaking, the optical circulator 103 is used to limited light to transmit along a specific direction, thereby accomplishing both lasing and signal modulation. Optical coupler 105 is coupled to the optical circulator 103 for receiving light, and it can transmit part of light out of the ring resonant cavity, and retain another part of light in the ring resonant cavity to keep being transmitted. The optical coupler 105 in the embodiment is 10:90 optical coupler, namely, the optical coupler 105 can transmit 10% of light back to the ring resonant cavity and transmit 90% of light into the single-mode fiber 107 out of the ring resonant cavity. The tunable optical filter 104 is coupled to the optical coupler 105, and it can filter the light retained in the ring resonant cavity, so as to acquire the desired wavelength. Further, the tunable optical filter 104 is also coupled to the optical circulator 103, such that the filtered light can be transmitted to the RSOA 102 through the optical circulator 103, whereby improving the power of light with single wavelength, and the signal generator 106 can provide modulated signals to the RSOA 102 and load those signals into light simultaneously, thereby generating laser light with modulated signals. Additionally, the single-mode fiber 107 is coupled to the optical coupler 105 for receiving the transmitted laser light. The optical de-multiplexer 108 is coupled to the single-mode fiber 107 for de-multiplexing the laser light with signals. And the signal receiver 109 is coupled to the optical de-multiplexer 108 for receiving the de-multiplexed signals.

Figure 2:
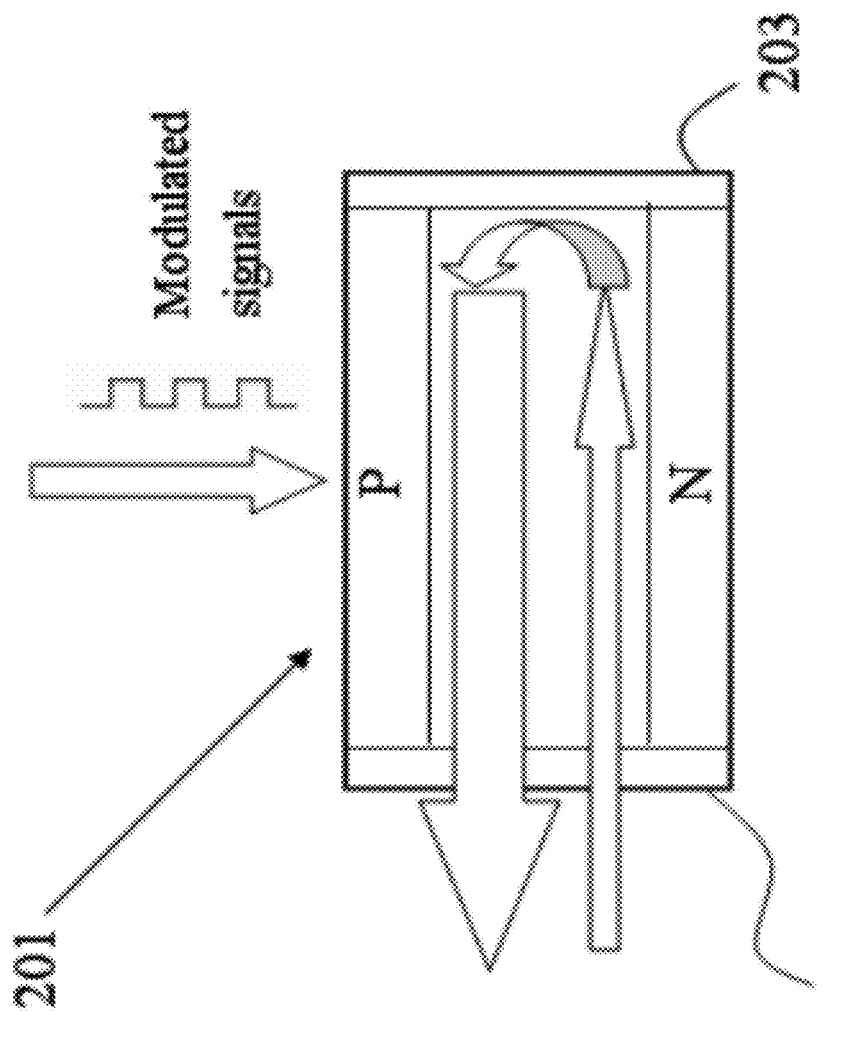
FIG. 2 shows the chip of the RSOA if the present invention.

The RSOA disclosed in the present invention includes a chip 201, referred to FIG. 2, the size of the chip 201 prefers to be 1×0.5 x0.15 mm$^3$. If the size of the chip 201 is smaller, the cost is lower. However, any skilled person in the art should understand that aforementioned size is just for explanation, not to limit the present invention. In the figure, the front surface 202 is the incident surface, and it is coated or covered a layer of medium with low reflective index, and the reflection coefficient is preferably less than $10^{-5}$. The rear surface 203 is the reflecting surface, and it is coated or covered a layer of medium with high reflective index, more specifically, the reflection coefficient is about 30%. Because the reflective index of the front surface 202 dramatically differs from that of the rear surface 203, the light can be emitted into the chip 201 through the front surface 202, and be reflected by the rear surface 203 and then be emitted out via the front surface 202.

Besides, the wave guide (not shown) of the front surface 202 has an angle, which can facilitate the output light to improve gain thereof. The signal generator (not shown) can transmit current with modulated signals into the chip 201, so that the light in the chip 201 can be loaded with aforementioned modulated signals and be transmitted to outside, thereby achieving the purpose of direct modulation. Specifically speaking, if the current transmitted into the chip 201 has consequent modulated signals, the power of light in the chip 201 can be fluctuated in the wake of aforementioned signals and be responded to the output light, so as to achieve the purpose of direct modulation. When the light is emitted into the chip 201, the incident light can be reflected and amplified. When the modulated signal is transmitted into the chip 201, the power of light can be fluctuated accordingly except being amplified, thereby achieving the effect of amplified gain and direct modulation. Furthermore, the RSOA of the present invention is operated under the saturation zone because the noise can be suppressed effectively when operated under the saturation zone, so that the laser light generated by the present invention can keep excellent quality after transmitted in a long distance.

Figure 3:
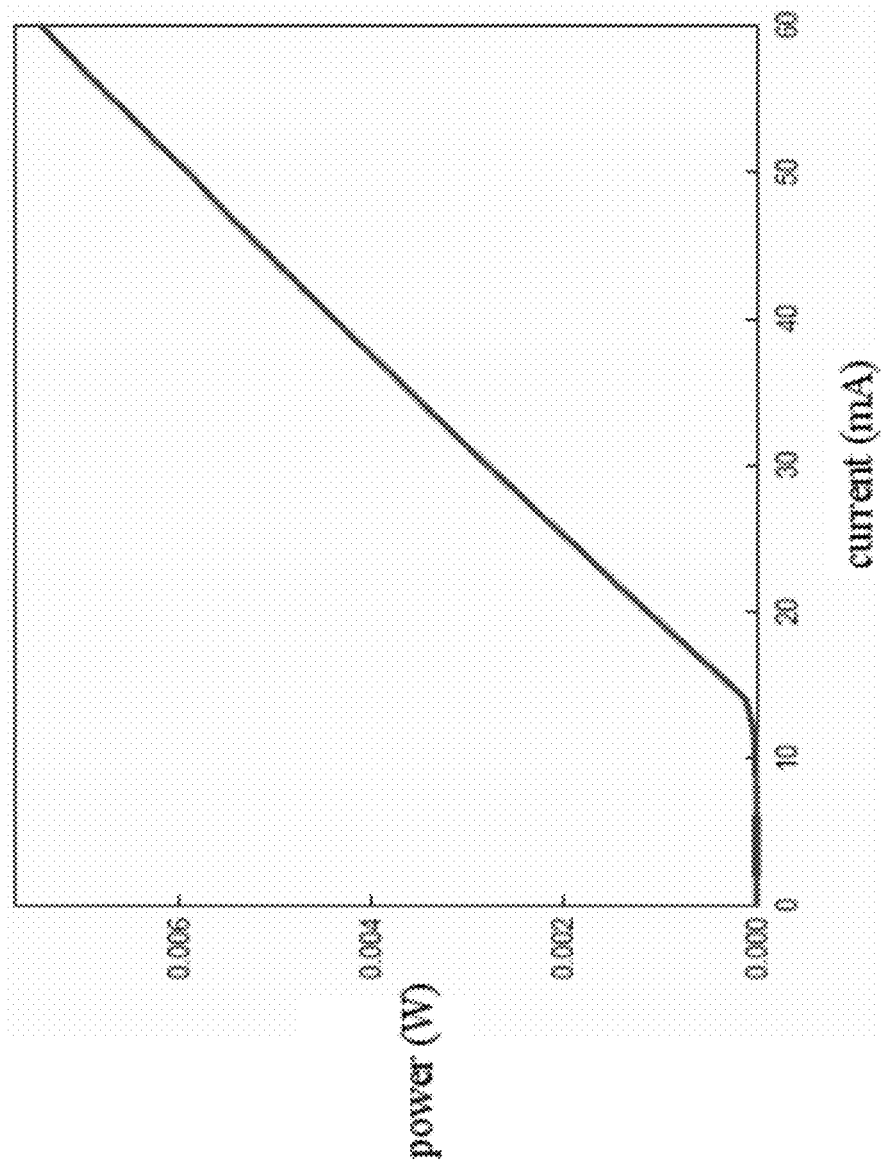
FIG. 3 shows the relation between driving current and power of the present invention.
Figure 4:
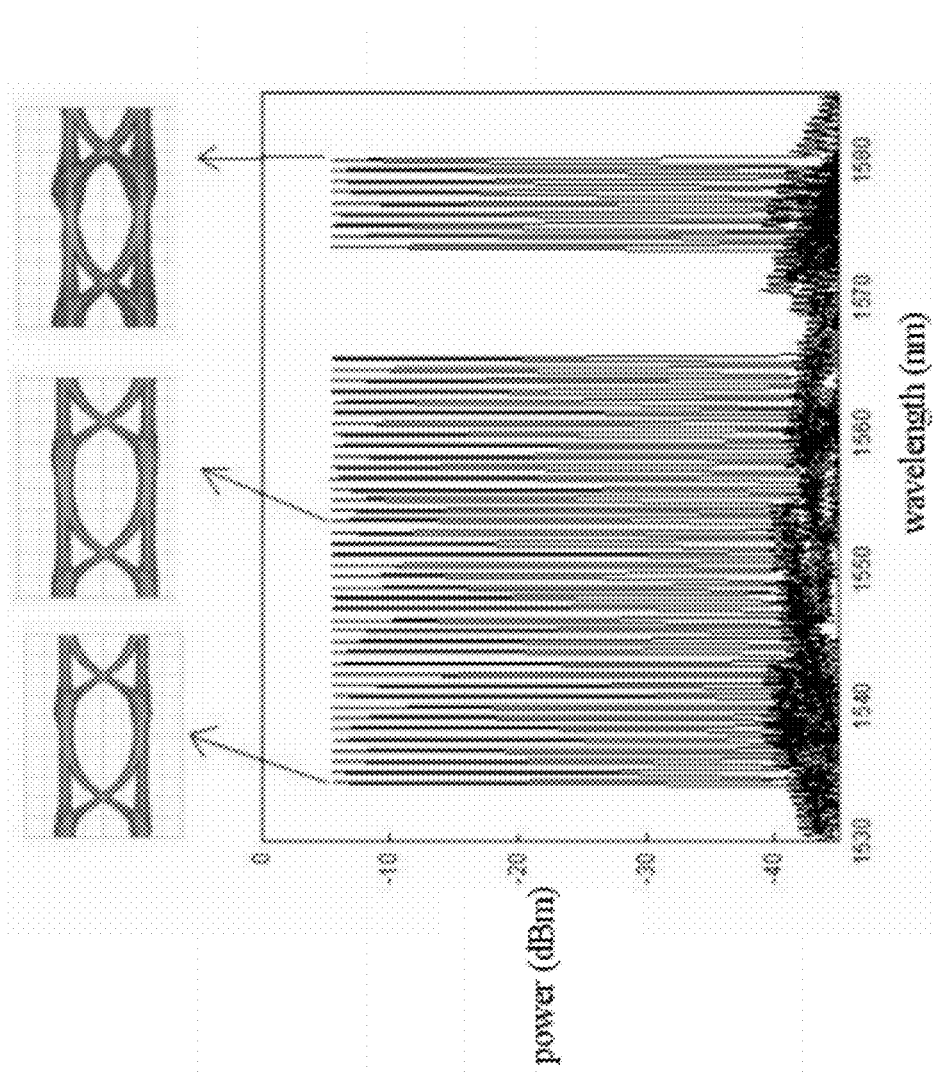
FIG. 4 shows the relation between wavelength and power of the present invention.
Figure 5:
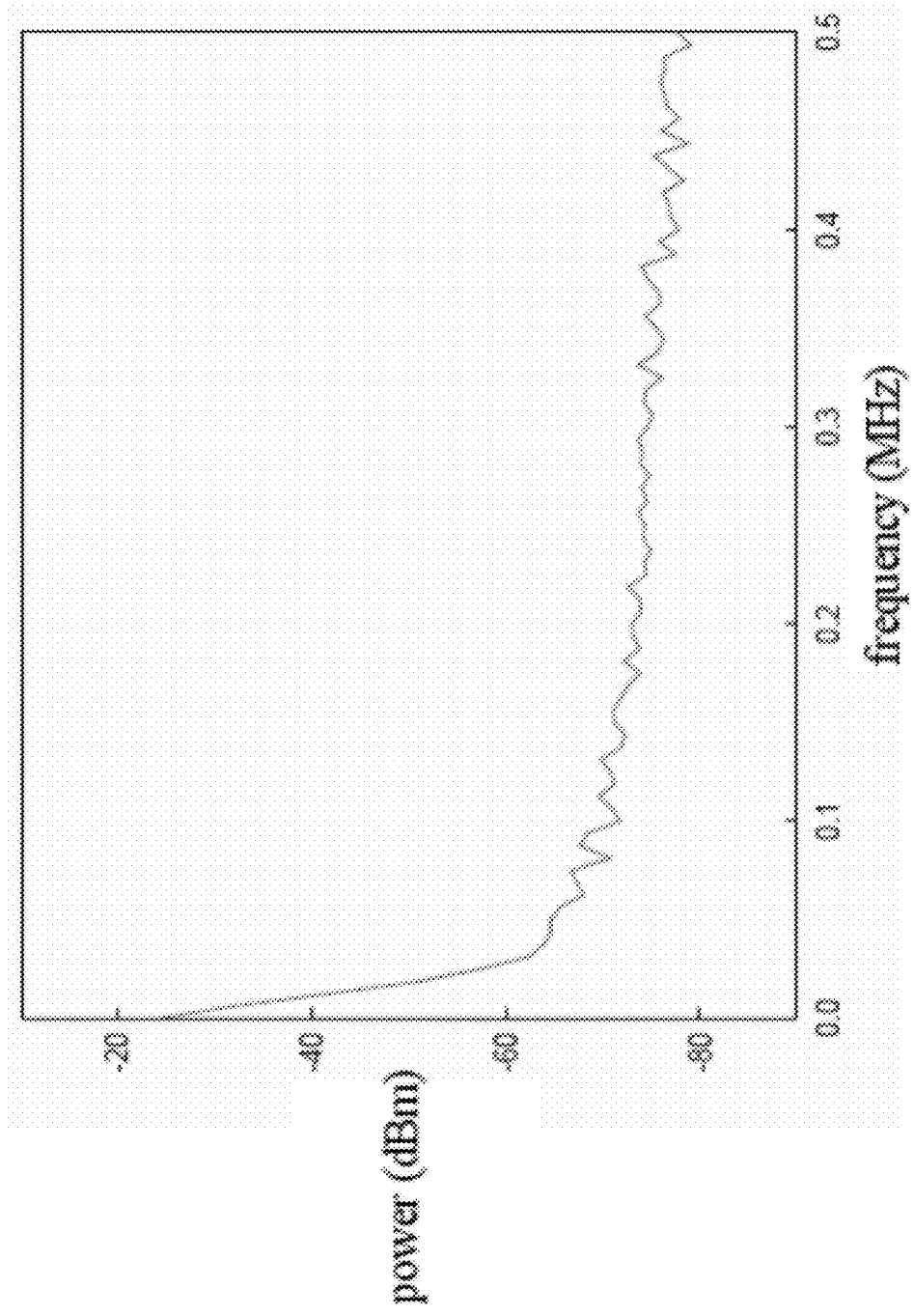
FIG. 5 shows the relation between frequency and power of the present invention.

To further understand the relation between the driving current and power of the fiber ring laser system, it can be referred to FIG. 3. As shown in the figure, the power is extremely low when the driving current is less than 14 mA, and nevertheless, the power increases linearly when the driving current is greater than 14 mA. Therefore, it can be noted that the critical current is about 14 mA, and the slope-efficiency ratio of power to current is 0.12 mW/mA. Besides, FIG. 4 exhibits the relation between wavelength and power for illustrating the spectral characteristic of laser, wherein the output power is good when the wavelength ranges between 1535 nm-1565.4 nm and 1573.6 nm-1580 nm. Thus, the wavelength tunable range covers about 1535 nm-1580 nm, totaling 45 nm, and that is broader than traditional fiber ring laser and further covers C-band and L-band generally used in optical communication, so the present invention can be widely applied on various communication systems. Moreover, the rate of loading modulated signals when wavelength is 1535, 1555, 1580 nm is 1.25 Gb/s. It can be observed that each eye diagram of aforementioned wavelength is quite clear without noise, and further, the SNR (Signal-to-Noise Ration) is about 11, which means the noises are suppressed effectively. Besides, the laser line width can be measured by an ESA (Electro Spectrum Analyzer). Referred to FIG. 5, the line width is 2.14-KHz when the broadband is 3 dB, and that is better than the line width of the EDF, which is 10-kHz. The performance of the present invention can be proved by aforementioned figures and experimental data.

Figure 6:
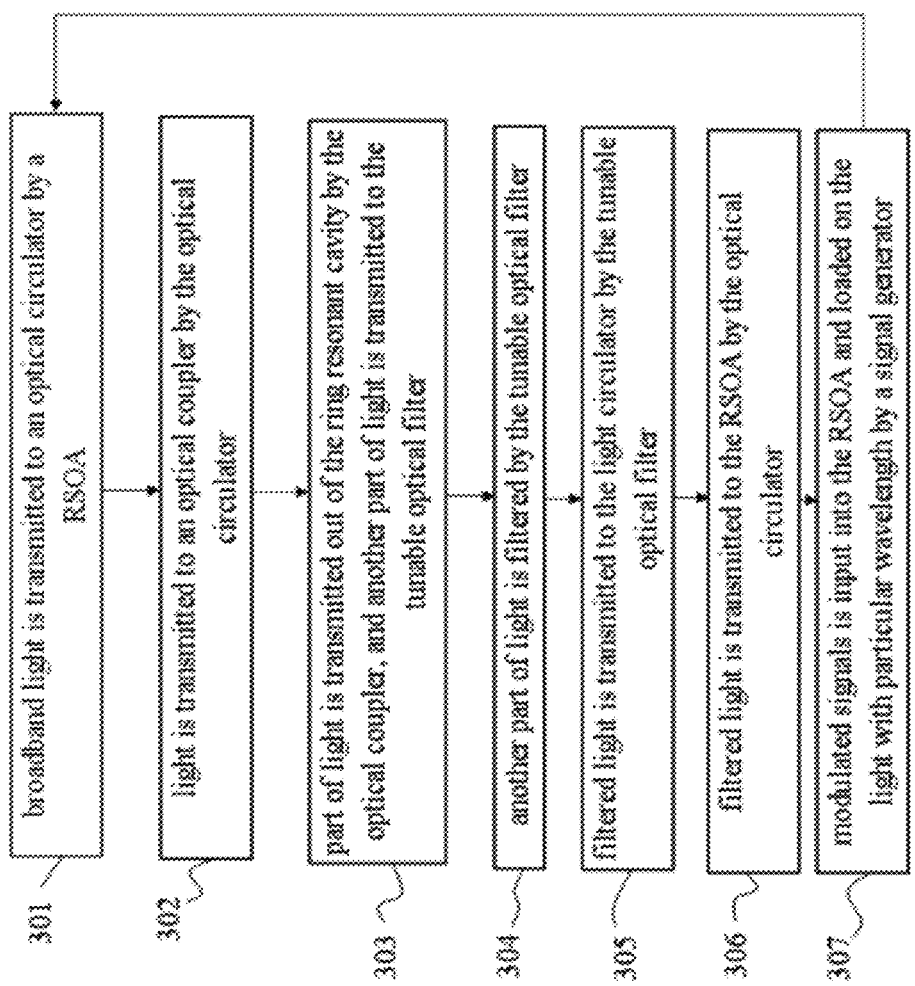
FIG. 6 shows the preferred embodiment of operation method of the present invention.

In another aspect, the present invention further discloses an operation method of the fiber ring laser. Referred to FIG. 6, which illustrates the detailed process, the steps are described as follows. First, the broadband light is transmitted to an optical circulator by a RSOA 301. Specifically, the RSOA is driven by a power supply, and it can generate broadband light owing to the ring-type fiber structure of a resonant cavity. Then, light can be transmitted to an optical coupler by the optical circulator 302, wherein the optical circulator is used for limiting the transmitting direction of light, so as to prevent light from transmitted to a tunable optical filter along the inverse way. Next, part of light can be transmitted out of the ring resonant cavity by aforementioned optical coupler, and another part of light can be transmitted to the tunable optical filter 303. In detail, the optical coupler of the present invention is 10:90 optical coupler. In other words, 90% of light can be transmitted out of the ring resonant cavity, and another 10% of light can be transmitted to the tunable optical filter. Later, aforementioned another part of light can be filtered by aforementioned tunable optical filter 304, whereby obtaining light with particular wavelength, that is, 10% of light can be filtered to be chosen the desired wavelength. Next, the filtered light can be transmitted to the light circulator by the tunable optical filter 305. And then, the filtered light can be transmitted to aforementioned RSOA by the optical circulator 306. Subsequently, modulated signals can be input into the RSOA and loaded on the light with particular wavelength by a signal generator 307, whereby generating light with modulated signals. And then, the steps 301-307 can be repeated, which means the light with modulated signals can be transmitted to the optical circulator and be processed with aforementioned steps.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A fiber ring laser system comprising:
    a signal generator, operable to provide modulated signals; and
    a ring resonant cavity, which includes:
        a reflective semiconductor optical amplifier (RSOA) coupled to said signal generator, whereby generating a light carrying said modulated signals and providing gain;
        an optical circulator coupled to said RSOA and configured to control the transmission direction of said light;
        an optical coupler coupled to said optical circulator and configured to output a first portion of said light out of said ring resonant cavity, and retain a second portion of said light in said ring resonant cavity;
        a tunable optical filter coupled to said optical coupler.

2. The fiber ring laser system according to claim 1, further comprising an optical polarization controller coupled between said RSOA and said optical circulator and is configured to control the polarization state of said light.

3. The fiber ring laser system according to claim 1, further comprising a single-mode fiber connected to said optical coupler and configured to transmit the outputted, first portion of said light to an optical de-multiplexer.

4. The fiber ring laser system according to claim 1, wherein the ratio of the first portion of said light to the second portion of said light is 9:1.

5. The fiber ring laser system according to claim 1, wherein the wavelength of said light is 1535-1580 nm.

6. An method for operating a fiber ring laser, the method including steps of:
    transmitting light from a reflective semiconductor optical amplifier (RSOA) to an optical coupler;
    outputting a first portion of said light out of a ring resonant cavity and transmitting a second portion of said light to a tunable optical filter by said optical coupler;

filtering the second portion of said light to obtain light with a specific wavelength and transmitting said light with the specific wavelength to said RSOA by said tunable optical filter;

transmitting modulated signals to said RSOA by a signal generator so that said light with the specific wavelength carries the modulated signals to form light carrying said modulated signals; and outputting a portion of said light carrying said modulated signals out of said ring resonant cavity.

7. The method according to claim 6, further comprising the step of receiving said light from said RSOA and transmitting said light to said optical coupler by an optical circulator.

8. The method according to claim 7, further comprising the steps of receiving said light with the specific wavelength from said tunable optical filter and transmitting said light with the specific wavelength to said RSOA by said optical circulator.

9. The method according to claim 6, further comprising the step of controlling the polarization state of said light emitted from said RSOA by an optical polarization controller.

10. The method according to claim 6, further comprising the step of transmitting said outputted light to an optical de-multiplexer via a single-mode fiber.

* * * * *